United States Patent
Iwanaga et al.

[11] Patent Number: 5,920,398
[45] Date of Patent: Jul. 6, 1999

[54] SURFACE POSITION DETECTING METHOD AND SCANNING EXPOSURE METHOD USING THE SAME

[75] Inventors: Takehiko Iwanaga; Yuichi Yamada, both of Utsunomiya; Shigeyuki Uzawa, Tokyo, all of Japan

[73] Assignee: Canon Kabushiki Kaisha, Tokyo, Japan

[21] Appl. No.: 08/805,749

[22] Filed: Feb. 25, 1997

[30] Foreign Application Priority Data

| Mar. 1, 1996 | [JP] | Japan | 8-068998 |
| Mar. 1, 1996 | [JP] | Japan | 8-068999 |

[51] Int. Cl.$^6$ .................................................. G01B 11/00
[52] U.S. Cl. ........................................ 356/401; 250/559.3
[58] Field of Search ..................................... 356/399–401, 356/237, 375; 250/559.3, 548; 355/43, 53

[56] References Cited

U.S. PATENT DOCUMENTS

| 4,563,094 | 1/1986 | Yamada . |
| 4,599,000 | 7/1986 | Yamada . |
| 4,655,599 | 4/1987 | Ayata et al. . |
| 4,794,648 | 12/1988 | Ayata et al. . |
| 4,906,326 | 3/1990 | Amemiya et al. . |
| 4,933,715 | 6/1990 | Yamada et al. . |
| 4,962,423 | 10/1990 | Yamada et al. . |
| 5,001,734 | 3/1991 | Uda et al. . |
| 5,008,703 | 4/1991 | Kawakami et al. . |
| 5,063,582 | 11/1991 | Mori et al. . |
| 5,112,133 | 5/1992 | Kurosawa et al. . |
| 5,118,957 | 6/1992 | Kawashima et al. . |
| 5,125,014 | 6/1992 | Watanabe et al. . |
| 5,128,975 | 7/1992 | Iwamoto et al. . |
| 5,131,022 | 7/1992 | Terashima et al. . |
| 5,138,643 | 8/1992 | Sakamoto et al. . |
| 5,142,156 | 8/1992 | Ozawa et al. . |
| 5,150,391 | 9/1992 | Ebinuma et al. . |
| 5,155,523 | 10/1992 | Hara et al. . |
| 5,157,700 | 10/1992 | Kurosawa et al. . |
| 5,168,512 | 12/1992 | Iwamoto et al. . |
| 5,172,402 | 12/1992 | Mizusawa et al. . |
| 5,172,403 | 12/1992 | Tanaka et al. . |
| 5,182,615 | 1/1993 | Kurosawa et al. . |
| 5,194,893 | 3/1993 | Nishi . |
| 5,231,291 | 7/1993 | Amemiya et al. . |
| 5,285,488 | 2/1994 | Watanabe et al. . |
| 5,317,615 | 5/1994 | Ebinuma et al. . |
| 5,323,016 | 6/1994 | Yamada et al. . |
| 5,347,118 | 9/1994 | Iwanaga . |
| 5,377,251 | 12/1994 | Mizusawa et al. . |
| 5,477,304 | 12/1995 | Nishi . |
| 5,499,099 | 3/1996 | Sato et al. . |
| 5,543,921 | 8/1996 | Uzawa et al. . |
| 5,585,925 | 12/1996 | Sato et al. . |
| 5,657,130 | 8/1997 | Shirasu et al. ........................ 356/401 |

FOREIGN PATENT DOCUMENTS

| 0585041 | 3/1994 | European Pat. Off. . |
| 0 634 700 | 1/1995 | European Pat. Off. . |
| 4-354320 | 12/1992 | Japan . |

*Primary Examiner*—K P Hantis
*Attorney, Agent, or Firm*—Fitzpatrick, Cella, Harper & Scinto

[57] ABSTRACT

A surface position detecting method for detecting a surface position of a surface to be examined, having surface height irregularity, while relatively scanning the surface, is disclosed. The method includes detecting characteristic data related to a surface state at plural measurement positions on the surface, while relatively scanning the surface, and processing the detected characteristic data related to the measurement positions to determine a measurement position for measurement of the surface position in a subsequent surface position detecting process.

16 Claims, 11 Drawing Sheets

SURFACE POSITION DETECTING METHOD AND SCANNING EXPOSURE METHOD USING THE SAME

FIELD OF THE INVENTION AND RELATED ART

This invention relates to a surface position detecting method for detecting the level (height) or tilt, for example, of a surface of a planar object such as a wafer, for example. More particularly, the invention is concerned with a surface position detecting method usable in a slit-scan type exposure apparatus, for successively detecting the position or tilt, for example, of a surface of a wafer with respect to the direction of an optical axis of a projection optical system. According to another aspect, the invention is concerned with a surface position setting method for an exposure apparatus, for example, and/or with a scanning exposure apparatus using this surface position detecting/setting method.

Recently the size of memory chips is increasing due to the difference between the tendency of cell size or resolvable line width of an exposure apparatus and the tendency of enlargement of memory capacity. As an example, for the first generation of 256M memories, the chip size is about 14×25 (mm).

For such chip size, with an exposure region of 31 mm diameter of a reduction projection exposure apparatus (stepper) currently used as an exposure apparatus for a critical layer, only one chip can be exposed with one exposure operation. Thus, the throughput is very low. An exposure apparatus capable of exposure with a larger area is therefore desirable.

As for larged filed-size exposure apparatus, there are reflection projection exposure apparatuses which are widely used as a semiconductor device exposure apparatus for use for a rough layer with which a high throughput is required, or as an exposure apparatus for the manufacture of large-field liquid crystal display devices such as monitors. Exposure apparatuses of this category comprise a slit scan type exposure apparatus, which is based on a mask-to-wafer relative scan wherein a mask is linearly scanned with illumination.light of an arcuate slit-like shape, and wherein a pattern of the mask is printed in a single exposure onto a wafer by means of a concentric reflection mirror optical system.

As regards the focusing of a mask image in these exposure apparatuses, in order to continuously keep the exposure surface of a photosensitive substrate (such as a wafer or a glass plate which is coated with a photoresist, for example) in registration with a best imaging plane of a projection optical system, height (level) measurement and autofocusing or auto-leveling correction drive are successively performed during the scan exposure process.

The surface position detecting mechanism in such apparatuses may employ method in which an oblique light projection optical system is used to project a light beam onto a wafer surface obliquely from the above and in which reflection light from the photosensitive substrate is detected as a positional deviation upon a sensor, and a method in which a gap sensor, such as an air microsensor or an elesctrostatic capacity sensor, is used. In these methods, from plural values of measured heights obtained during the scan, a correction drive amount for the height and the tilt of the water as a measurement position passes an exposure slit region is calculated and, based on this, a correction is made.

If, in currently used slit scan type exposure apparatuses, only the projection system thereof is modified to provide a resolving power that can meet the capacity of 256M or larger, the following problems will be produced.

Namely, with enlargement of the numerical aperture (N.A.) of a reduction projection system to satisfy the desire for miniaturization of circuit pattern, the tolerable depth of focus in the circuit pattern transfer process becomes narrower and narrower. With exposure apparatuses currently used for rough processes, a tolerable depth of focus of not less than 5 microns is assured. Therefore, a measurement error which may be included in measured values, successively measured during the scan exposure process, or the effect of a surface level difference within a chip may be disregarded. However, in consideration of the capability to produce memories of 256M, the tolerable depth is 1 micron or less. Thus, a measurement error in measured values or the effect of surface level difference within a chip could not be disregarded.

Further, in the exposure sequence according to conventional stepper type process, after completion of focus correction at the exposure position, the sequence goes on uninterruptedly (in series) to the start of exposure. Thus, any dispersion of focus measurement time does not have an influence on the precision. With the exposure sequence according to the slit scan type process, however, the exposure process is being done even during focus measurement. That is, both of them are performed simultaneously, in parallel processing. Therefore, any dispersion of focus measurement time will apply an influence, as a time delay component, upon the feedback loop of the focus correction system as a whole, including the driving system and, as a result, it may cause degradation of focus correction precision.

Moreover, there is the problem of a surface level irregularity existing on the chip surface, which must be dealt with to accomplish high precision focus detection. As an approach from the process side, in relation to the insufficiency of a tolerable depth of focus, those methods which use a recess array or Chemical Mechanical Polishing (CMP) to provide a surface step structure of low level difference have been developed. Even with those methods, there still remains a surface level difference of about 0.5 micron. Particularly with regard to a peripheral circuit portion or a scribe line portion, a step-like surface level difference structure remains. At such a structure portion, even after application of a resist material, there remains a shallow inclination on the surface and, as a result of it, the following problems are produced.

Namely, when a surface having such shallow inclination is to-be detected by use of an oblique light projection type height detection system, there is a possibility that the intensity of detection light becomes extraordinarily low. This is because in this detection system, the detection light path is limited so as to detect only reflection light having substantially the same angle as the incidence angle, to thereby avoid reception of noise light. If the diameter of a light receiving stop at the detection light path side is enlarged in an attempt to increasing the intensity of detection light from the inclined surface portion, the intensity of noise light also increases which, as a consequence, enlarges the measurement error. It is therefore undesirable to enlarge the diameter of the light receiving stop immoderately.

When the inclined surface region of the portion to be measured is small as compared with the size of the detection beam, the shape of a detection waveform may be deformed asymmetrically, which in turn may result in a large measurement error. Such a phenomenon may easily appear particularly in relation to a scribe line portion, as compared with the chip region, with respect to which no process control is made. Also, there is small reproducibility within the wafer. It is therefore difficult to correct the same by use of an offset. If under such a situation focus measurement in slit scan is done, there is a possibility that the focus detection is disabled in the course of the scan exposure, such that the scan exposure is interrupted. Alternatively, a large defocus may be created to cause the production of defective chips.

Measured values which may cause a problem may be excluded during the measurement in the scan exposure. However, executing such processing within a limited measurement time may make the system more complicated. Even if such a system is arranged, a variation of measurement time or a decrease of throughput may cause degradation of focus precision. Namely, in a system in which the focus correction is to be made in real-time fashion and the exposure process is to be made simultaneously therewith, what is most important is smooth operational association between units. If the balance is destroyed, there will occur various problems, such as the shift of offset correction timing or a phase shift of the delay compensation in the correction system and, finally, resolution performance as designed will not be provided.

On the other hand, in autofocusing or auto-leveling in a slit scan type exposure apparatus, a wafer moves during the exposure process and, for this reason, there is a possibility that, in accordance with the rate determination by the response speed of a focus plane detection system and of a wafer stage height (wafer height) driving system, a following-up error (i.e., focus error) is created.

This will be explained in detail, in conjunction with FIG. 10. In FIG. 10(a), it is assumed that a pattern of a reticle is going to be printed on an exposure region C on the surface of a wafer 41 which is being moved in a direction of an arrow X. If height measuring means 40A is provided at a position of the center A of the exposure region C and the wafer stage drive is performed on the basis of a measured value therefrom, because of the response delay described above, the wafer surface cannot follow the focus plane. In consideration of this, usually in scan type exposure apparatuses the height measuring means is provided at a position different from the point A on the exposure region C and the height of the wafer surface is measured beforehand. As that position comes to the exposure position, the wafer height is adjusted into the exposure plane. In FIG. 10(a), height measuring means 40B is provided at a position before the exposure region center A with respect to the wafer movement direction, which position is spaced by a distance d from the center A. At the moment as the point A comes to the position just below the height measuring means 40B, the height of the wafer surface at the point A is measured. Then, at the moment as the point A comes to the position below the exposure region C, the wafer height is adjusted to the exposure plane. The sampling interval in this case corresponds to the time period ($t_s$=d/s where s is the wafer scan speed) by which the wafer moves through the distance d.

FIG. 10(b) shows the relation among a wafer surface 41, a wafer height 42 as moved, and a difference between the wafer surface 41 and the wafer height 42 as moved, that is, the focus error 43, in a case where the response speeds of the detection system and the driving system are slow as compared with the wafer scan speed (sampling interval $t_s$). Due to such response delay, there is a large focus error.

FIG. 10(c) shows the relation among a wafer surface 41, a wafer height 44 as moved, and a focus error 45 in a case where the response speeds of the detection system and the driving system are higher, as compared with the wafer scan speed. Since the response speed is higher than the measurement interval, there is a larger focus error between measurement points.

FIG. 10(d) shows an example where the sampling interval is shortened so as to avoid this. The sampling interval is made to be equal to the time in which the wafer moves through a distance d/5. Also, there is shown the relation among a wafer surface 41, a wafer height 46 as moved, and a focus error 47. The focus error is small, and good following-up is assured.

However, shortening the sampling interval will cause the following problems. As a result of flattening through a CMP method, for example, to the cell portion and the peripheral circuit portion, within the wafer surface there may be a surface level difference of only about 1 micron. However, when a wafer outer peripheral portion is to be exposed and the drive is to be performed from the outside to the inside of the wafer, the wafer height has to be changed by a few tens of microns within a time period in which the wafer moves through a distance d of the spacing of sensors. Thus, it is not possible to determine the sensor spacing d on the basis of only the surface level difference within the wafer. Further, when the sampling interval is to be reduced and if an accumulation type detecting means, such as CCD, for example, is used, a finite accumulation time is necessary and it defines the rate determination. Also, the quantity of traffic flowing through the data bus of the measurement system increases. As a result, the control system becomes complicated and expensive.

The above-described points are problems of the wafer height measuring system. In addition to them, there is a problem of abbe error which may be created by inclination of the surface of a bar mirror of a laser interferometer when the wafer height is changed. In conventional apparatuses in which a wafer is exposed while it is held stationary, such abbe error is corrected by moving the stage in X and Y directions by an amount effective to correct other components (X and Y components) created by the wafer height driving. Moving the X-Y stage takes a longer time until the target position is reached, as compared with a case where drive is performed in the wafer height direction, since the mass of the components to be driven is larger. However, in these types of apparatuses, the exposure process starts after the X-Y stage reaches the target position. Thus, there is no possibility that the abbe correction has an influence upon the printing linewidth precision or exposure position precision, for example.

In scan type exposure apparatuses, however, since the abbe correction has to be done during scan of the stage, the following problem will arise. When a reticle and a wafer are scanned for exposure by use of a scan type exposure apparatus, the wafer stage and the reticle stage have a large mass as described and, therefore, fine control of them is not easy to achieve. Usually, the drive pattern for them is based on a trapezoidal profile drive in which a constant-speed portion of the drive profile is used for the printing process. If abbe correction drive is added to this, the target value for the constant-speed profile portion during the printing process has to be rewritten. If the amount of changing the target value is large, vibration may be created in relation to the stage drive, which vibration, in turn, may result in degradation of linewidth precision of the printing process. Such a problem will be more notable with enlargement of the wafer size to 10-inch or 12-inch wafer and with corresponding increases in mass of the stage.

SUMMARY OF THE INVENTION

It is accordingly an object of the present invention to provide an improved surface position detecting method by which at least one of the problems described hereinbefore can be solved.

In accordance with an aspect of the present invention, there is provided a surface position detecting method for detecting a surface position of a surface to be examined, having surface height irregularity, while relatively scanning the surface, the method comprising the steps of: detecting characteristic data related to a surface state at plural measurement positions on the surface, while relatively scanning the surface; and processing the detected characteristic data related to the measurement positions to determine a measurement position for measurement of the surface position in a subsequent surface position detecting process.

In this characteristic data detection, surface position data and a characteristic amount which represents a shape of a detection signal may be detected.

In accordance with another aspect of the present invention, there is provided a scanning exposure method for printing a pattern of an original on to a substrate while relatively scanning the original and the substrate, the method comprising the steps of: detecting characteristic data related to a surface state at plural measurement positions on the surface of the substrate, while relatively scanning the substrate surface; and processing the detected characteristic data related to the measurement positions to determine a measurement position for measurement of the surface position to the substrate surface in surface position detection during a scanning exposure process.

In this characteristic data detection, surface position data and a characteristic amount which represents a shape of a detection signal may be detected.

The characteristic data detection may include detecting the characteristic data while performing the relative scan at a scan speed lower than the scan speed during the scan exposure process.

The determination of measurement position may include determination of a measurement position for measurement of the surface position of the substrate surface in accordance with a scan speed during the scan exposure process.

The substrate may comprise a wafer on which a pattern is formed.

The method may further comprise the steps of detecting characteristic data related to plural wafers each having the same pattern as of the wafer, memorizing measurement position information determined on the basis of the characteristic data, and performing surface position measurement to each of said plural wafers on the basis of at least one of the memorized measurement positions.

In accordance with a further aspect of the present invention, there is provided a surface position setting method for setting a surface position of a substrate, the method comprising: a measuring step for measuring a surface position of the substrate surface at a measurement position, while relatively scanning the substrate surface relative to the measurement position; a driving step for setting a target value, when a predetermined location on the substrate having passed the measurement position is placed at a predetermined position in a scan direction, on the basis of a measured value obtained in the measuring step, and for moving the substrate so that the surface position of the substrate is registered with the target value; a setting step for setting a time interval for changing the target value in the driving step, to be shorter than a time interval of measurement in said measuring step; and a determining step for determining a target value in relation to a particular location between different measurement positions on the substrate, on the basis of measured values related to those measurement positions before and after the particular location.

In the determining step, the target value in relation to the particular location may be determined on the basis of the interpolation of the measured values related to those measurement positions before and after the particular location.

The interpolation may comprise one of linear interpolation and multiple approximation interpolation.

The method may further comprise the steps of measuring a position of the substrate with respect to one of the scan direction and a direction perpendicular to the scan direction, performing a correction drive to move the substrate to a predetermined position, and setting a time interval for the correction drive to be shorter than the time interval for the surface position measurement.

In accordance with a still further aspect of the present invention, there is provided a scanning exposure method for printing a pattern of an original on to a substrate while relatively scanning the original and the substrate, the method comprising: a measuring step for measuring a surface position of the surface of the substrate at a measurement position, while relatively scanning the substrate surface relative to the measurement position; a driving step for setting a target value, when a predetermined location on the substrate having passed the measurement position is placed at an exposure position, on the basis of a measured value obtained in said measuring step, and for moving the substrate so that the surface position of the substrate is registered with the target value; a setting step for setting a time interval for changing the target value in said driving step, to be shorter than a time interval of measurement in said measuring step; and a determining step for determining a target value in relation to a particular location between different measurement positions on the substrate, on the basis of measured values related to those measurement positions before and after the particular location.

In the determining step, the target value in relation to the particular location may be determined on the basis of interpolation of the measured values related to those measurement positions before and after the particular location.

The interpolation may comprise one of linear interpolation and multiple approximation interpolation.

The method may further comprise measuring a position of the substrate with respect to one of the scan direction and a direction perpendicular to the scan direction, performing a correction drive to move the substrate to a predetermined position, and setting a time interval for the correction drive to be shorter than the time interval for the surface position measurement.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will be described with reference to the drawings.

First Embodiment

Figure 1:
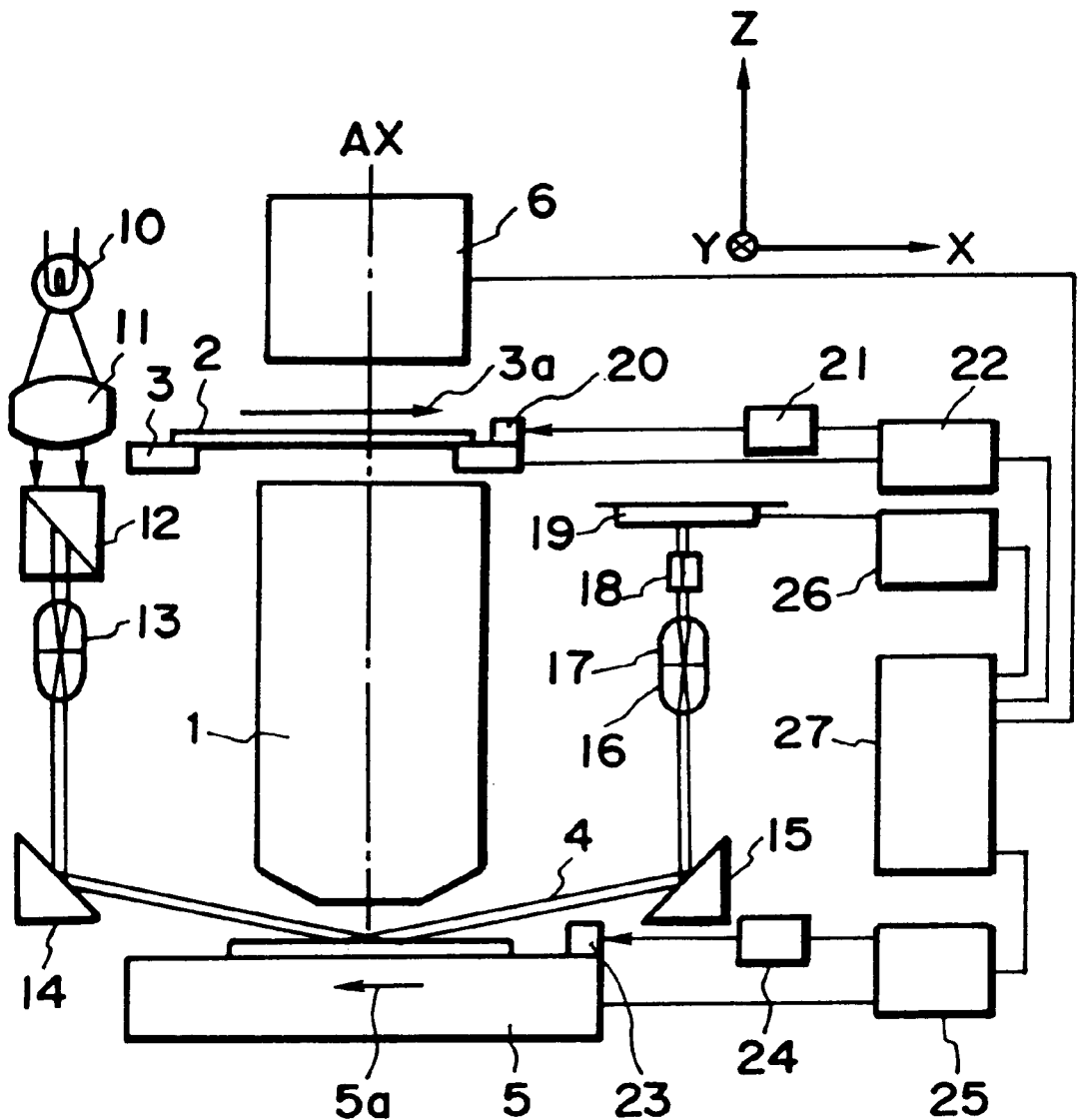
FIG. 1 is a schematic view of a main portion of a slit scan type projection exposure apparatus which uses a surface position detecting method according to an embodiment of the present invention.

FIG. 1 is a schematic view of a portion of a slit-scan type projection exposure apparatus which is based on a surface position detecting method according to an embodiment of the present invention.

Denoted in FIG. 1 at 1 is a reduction projection lens having an optical axis, denoted at AX in the drawing, and an image plane which is placed perpendicularly to the Z direction illustrated. Reticle 2 is held by a reticle stage 3. The pattern of the reticle 2 is projected in a reduced scale of ¼ or ½, according to the magnification of the projection lens, whereby an image of the pattern is formed on the image plane of the projection lens. Denoted at 4 is a wafer having a resist coating on its surface. There are a number of exposure zones (shots) on the wafer surface, which have been defined through a preceding exposure process or processes. Denoted at 5 is a stage for carrying a wafer thereon. The stage 5 includes a chuck for holding the wafer 4 on the wafer stage, by attraction, an X-Y stage being horizontally movable in X-axis and Y-axis directions, a leveling stage being movable in Z-axis direction (optical axis direction of the projection lens 1) and also being rotationally movable about axes parallel to the X and Y axes, respectively, and a rotatable stage being rotationally movable about an axis parallel to the Z axis. The stage mechanism thus provides a six-axis correction system for bringing a reticle pattern image into registration with each exposure zone on the wafer.

The elements in FIG. 1 denoted by reference numerals 1–10 function as components of a detection optical system for detecting the surface position or tilt of the wafer 4. Denoted at 10 is a light source. It may comprise a white lamp, or it may comprise an illumination unit which is arranged to project light of a high-luminance light emitting diode, having different peak wavelengths. Denoted at 11 is a collimator lens which receives the light from the light source 10 and projects parallel light having a substantially uniform sectional intensity distribution. Denoted at 12 is a slit member of prism-like shape, and it comprises a pair of prisms being cemented to each other so that their slant surfaces are opposed to each other. At the cemented surfaces, there are plural openings (e.g., six pinholes) which are defined by use of s chromium film, for example. Denoted at 13 is a lens system of a dual-telecentric system, which serves to direct six light beams having passed through the pinholes of the slit member 12, respectively, to six measurement points on the wafer 4 surface, via a mirror 14. While only two beams are illustrated in the drawing, each beam represents three beams juxtaposed in parallel to each other with respect to the direction perpendicular to the sheet of the drawing. Here, with respect to the lens system 13, the plane on which the pinholes are formed and the plane including the wafer 4 surface are set to satisfy Scheinmpflug's condition.

Figure 2:
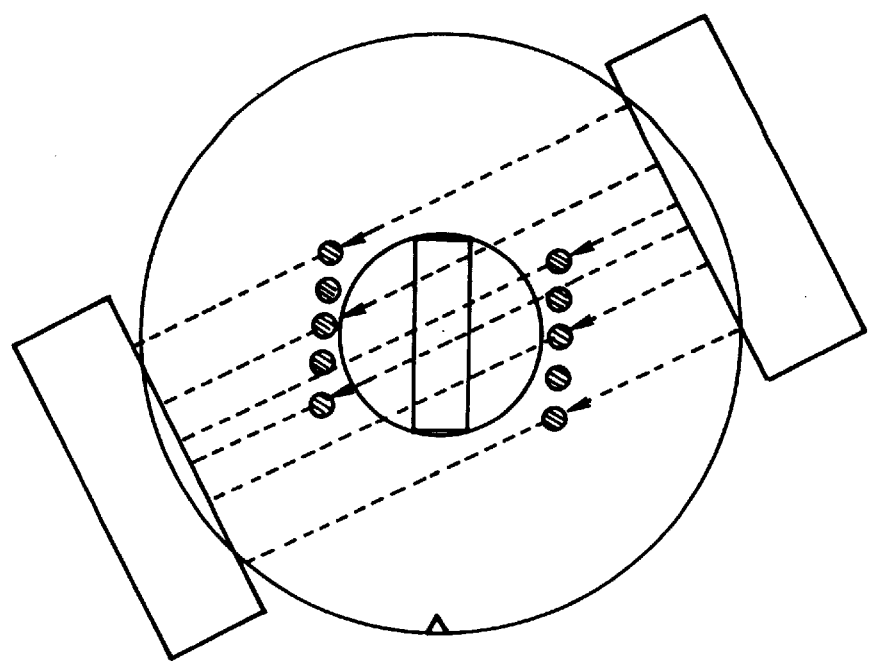
FIG. 2 its a schematic view for explaining the positional relationship between an exposure slit and measurement points, in the surface position detection through a detection optical system of the FIG. 1 embodiment.
Figure 3:
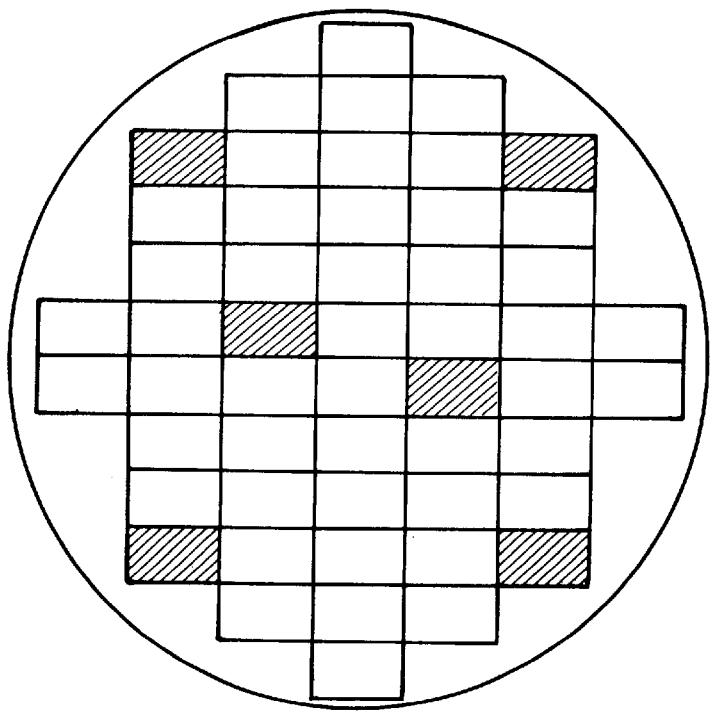
FIG. 3 is a schematic plan view for explaining an example of the disposition of exposure regions on a wafer and selection of sample shots for prescan in an embodiment of the present invention.

In this embodiment, the incidence angle $\Phi$ of each light beam from the light projecting means on to the wafer 4 surface (the angle with respect to a line normal to the wafer surface, i.e., with respect to the optical axis) is $\Phi$=70 deg. or more. As shown in FIG. 3, there are a plurality of pattern regions (exposure zone shots) juxtaposed, on the wafer 4 surface. The six light beams passing the lens system 13 are incident on separate measurement points in a particular pattern region, as shown in FIG. 2, and they are imaged thereon. Also, in order that the six measurement points may be observed upon the wafer 4 surface independently of each other, the light beams are projected in a direction rotated by an angle $\theta$ (e.g., 22.5 deg.) within the X-Y plane, from the X direction (scan direction).

The above-described arrangement enables optimum spatial disposition of various components, as proposed in Japanese Patent Application, Application No. 157822/1991, filed in the name of the assignee of the subject application, and ensures high-precision detection of surface position information.

Next, the portion for detecting reflection light from the wafer 4, namely, components 15–19, will be described. Denoted at 16 is a light receiving lens of a dual telecentric system, which serves to receive six reflection light beams from the wafer 4 surface. Stopper 17 disposed within the light receiving lens 16 serves as a common stop in relation to the six measurement points, and it serves to block higher-order diffraction light (noise light) which may be created by a circuit pattern formed on the wafer 4. The light beams passing the light receiving lens 16, comprising a dual telecentric lens system, have their optical axes disposed parallel to each other, and they are re-imaged upon a detection surface of a photoelectric converging means group 19, by means of six separate correction lenses of a correction optical system group 18, so that they form light spots of the same size upon the detection surface. This light receiving side, namely, components 16–18, is arranged to provide tilt correction so that all the measurement points on the wafer 4 surface and the detection surface of the photoelectric converting means group 19 are placed in an optically conjugate relation with each other. Therefore, any local inclination at any measurement point does not cause a change in position of a pinhole image upon the detection surface. Thus, in response to a change in level (height) of each measurement point with respect to the optical axis AX direction, the pinhole image displaced upon the detection surface.

Here, the photoelectric converting means group 19 comprises six one-dimensional (linear) CCD line sensors. This is advantageous over use of a two-dimensional (area) sensor, for the following reasons. First, because of the separation of photoelectric converting devices, in the design of the correction optical system group 18, the latitude of disposition of various optical elements and a mechanical holder becomes larger. Further, while the optical magnification from the mirror 15 to the correction optical system group 18 should be made large for enhanced resolution of detection, also in this respect, the arrangement of dividing the light path so that separate lights are incident on individual sensors, respectively, enables the compact disposition of elements. Moreover, in the slit-scan method, it is inevitable to execute successive focus measurements during the exposure process and therefore reduction of measurement time is an absolutely required factor. With conventional two-dimensional CCD sensor, although it may be attributable to reading-out of data, more than required, it takes a read-out time ten times longer or more of that with a one-dimensional CCD sensor.

Next, an exposure system of a slit-scan type will be described.

As shown in FIG. 1, the reticle 2 is held by attraction on the reticle stage 3. Thereafter, it is scanningly moved at a constant speed, along a plane perpendicular to the optical axis AX of the projection lens 1 and in a direction RX (X-axis direction). Also, with respect to a direction RY (Y-axis direction, perpendicular to the sheet of the drawing), correction drive of the reticle is performed so that a target coordinate position is constantly scanned. Positional information of the reticle stage with respect to the X direction and the Y direction, is continuously measured by projecting a plurality of laser beams, from an external reticle interferometer system (X and Y) 21, onto an X-Y bar mirror 20 which is fixedly provided on the reticle stage 3 of FIG. 1.

Exposure illumination optical system 6 uses a light source, such as an excimer laser, for example, which produces pulse light. While not shown in the drawing, the exposure illumination optical system 6 further comprises a beam shaping optical system, an optical integrator, a collimator and a mirror, for example. These components are made of a material or materials effectively transmitting or reflecting pulse light of the deep ultraviolet region. The beam shaping optical system serves to transform a received light beam into a desired sectional shape, including size. The optical integrator serves to make uniform the distribution characteristic of light so that the reticle 2 may be illuminated with uniform illuminance. By means of a masking blade, not shown, provided in the exposure illumination optical system 6, a rectangular illumination region corresponding to the chip size is defined. A pattern of the reticle 2 as locally or partially illuminated with that illumination region, is projected by the projection lens 1 onto the wafer 4, which is coated with a resist material.

Main control 27 shown in FIG. 1 controls the whole system so that the scanning exposure process is performed to scanningly expose a predetermined zone on the wafer 4 with a slit image of the reticle 2, while adjusting the position within the X-Y plane (X and Y positions as well as rotation θ about an axis parallel to Z axis) and the position in Z direction (rotations α and β about axes parallel to X and Y axes, respectively, as well as height Z along the Z axis). More specifically, as regards alignment of the reticle pattern within the X-Y plane, control data is calculated from positional data obtained through the reticle interferometer 21 and a wafer stage interferometer 24 as well as from wafer positional data obtained through an alignment microscope, not shown. In accordance with the thus produced control data, a reticle position control system 22 and a wafer position control system 25 are controlled, to accomplish the alignment. When the reticle stage 3 is scanningly moved in a direction of an arrow 3a in FIG. 1, the wafer stage 5 is moved in a direction of an arrow 5a in FIG. 1, at a speed corrected in accordance with the reduction magnification of the projection lens. The scanning speed of the reticle stage 3 may be determined to provide a higher throughput, on the basis of the width of the masking blade (not shown) of the exposure illumination optical system 6 in the scan direction and the sensitivity of a resist material applied to the wafer 4 surface.

As regards alignment of the reticle pattern with respect to the Z-axis direction, namely, registration with the image plane, it is performed so that, on the basis of the result of calculation in a surface position detecting system 26, which serves to detect height data of the wafer 4, the leveling stage of the wafer stage is controlled by means of the wafer position control system 25. More specifically, from the height data at three measurement light spots, for wafer surface level measurement, defined in the vicinity of the slit with respect to the scan direction, the tilt in a direction perpendicular to the scan direction as well as the height with respect to the optical axis AX direction are calculated. Then, on the basis of this, a correction amount for an optimum image plane position, at the exposure position, is determined. Correction is made in accordance with this determination.

Figure 4:
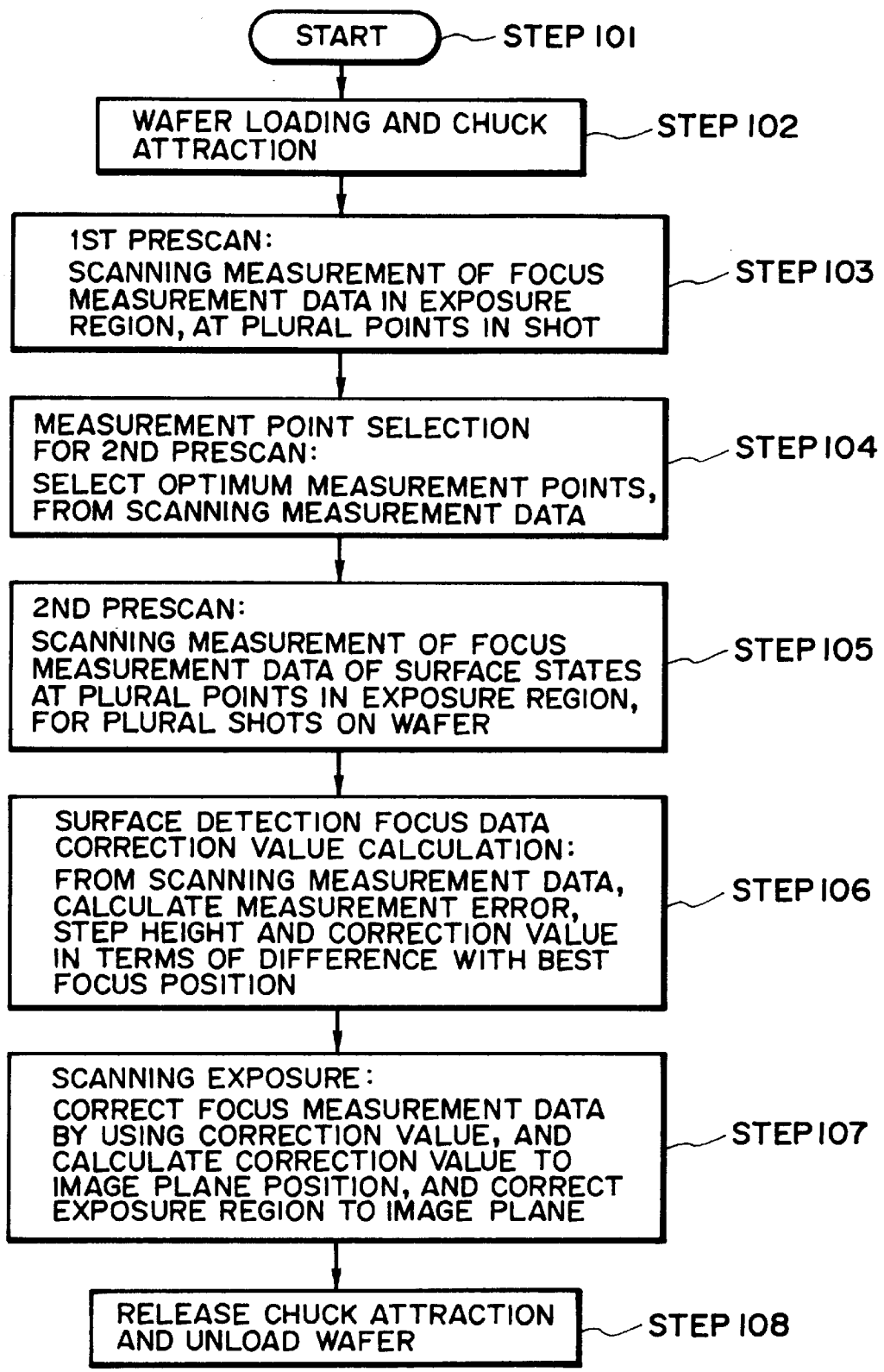
FIG. 4 is a flow chart for explaining the outline of a sequence from wafer loading to wafer unloading, in the apparatus of FIG. 1.

Next, a method of detecting the position of an exposure region on the wafer 4, in accordance with a surface position detecting method of the present invention, will be explained. Referring first to the flow chart of FIG. 4, an outline of the correction method will be described.

In response to a start command at step 101, a wafer is loaded on to the stage, and it is attracted to and held by the chuck, at step 2. Thereafter, for measurement of surface shape inside an exposure region of a chip, at step 103 prescan measurement is performed in a predetermined sample shot region. Then, at step 104, by using a measured scan focus detection value, measurement points for measurement of focus detection value, best for correction of the exposure region into the exposure image plane position, are selected. After the selection, at step 105, for determination of a correction term for specifying the surface shape within the exposure region of the chip, prescan measurement is performed again with respect to plural sample shot regions. At step 106, by using the measured scan focus detection value, a correction term for correcting the measured value, during the scan, into the optimum exposure image plane position, is determined. After calculation of the correction term, at step 107 the scan exposure sequence for respective exposure positions is initiated, and, while correcting a focus detection value at a selected measurement position with the correction value, calculation of the correction amount for registering the exposure region with the exposure image plane as well as corrective drive are performed.

Next, a method of measurement position selection for measurement of a best focus detection value, will be described in detail. Before it, a method of determining a focus measurement point in scanning exposure process, will be explained. Since in the stepper type exposure process, the stage is stopped at the exposure position, a determination may be accomplished by measuring the focus at the stopped position and correcting it, that is, by performing focus and tilt measurement with respect to at least one location common to shots. Since however in the scan type exposure process the stage moves continuously during the exposure of a shot, measurement has to be made to plural points in the shot. Further, the measurement position or timing has to be determined in consideration of many factors, such as association with a driving system, slit width, scan speed and the like. If, as for such determination factors, there are a slit width Ws, a focus measurement time Tm, a focus correction time Td, and a stage scan speed V, in a case where the periodicity of surface irregularity of the exposure region is f, from the sampling theorem the correction cycle 1/(Tm+Td) in the exposure process should be not smaller than 2f. Namely, if the period of surface irregularity, taking a peripheral circuit portion as one period, is 3 mm, then the cycle time in a case where the correction including detection and/or correction of that surface irregularity is to be executed should be not longer than 3/(2×V). In such case, if the scan speed V is V=100 mm/sec., the cycle time is equal to 15 ms. If correction is included and in consideration of response time of the driving system, it may be difficult to accomplish. A practical solution may be slowing down the scan speed. However, it is not desirable because the throughput decreases. If however this time period is assigned only to the detection, the detection can well be accomplished and it is possible to detect the surface state of the wafer. From this point, with the method in which the surface state is detected by prescan and the characteristic of the surface irregularity of the exposure surface is detected thereby and in which the measurement position in an actual exposure process, as necessary for detection in an actual exposure process and as can be corrected from the correction cycle time, is determined, it is possible to provide a scan system which enables focus correction without decreasing the throughput. Also, since in the exposure process, the exposure area has a finite slit width Ws, for each slit size a correction precision similar to that of a stepper can be accomplished, provided that a relation with which focus measurement can be performed with respect to at least one point within the slit, namely, a relation Ws/V>(Tm+Td), is satisfied. In consideration of that, focus is averaged during the scan exposure, and it will be readily understood that such correction system as described is good enough.

EXAMPLE 1

Figure 5A:
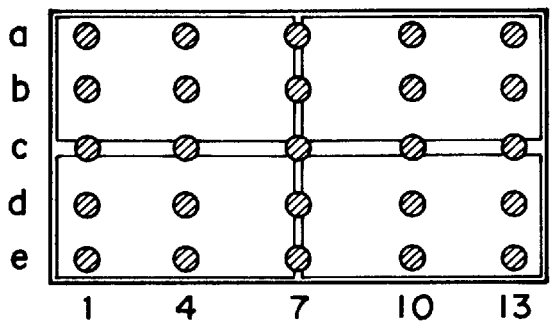
FIGS. 5A and 5B are schematic views, respectively, for explaining the measurement points on a chip of a wafer and measured values at these measurement points, in the embodiment of FIG. 1.
Figure 5B:
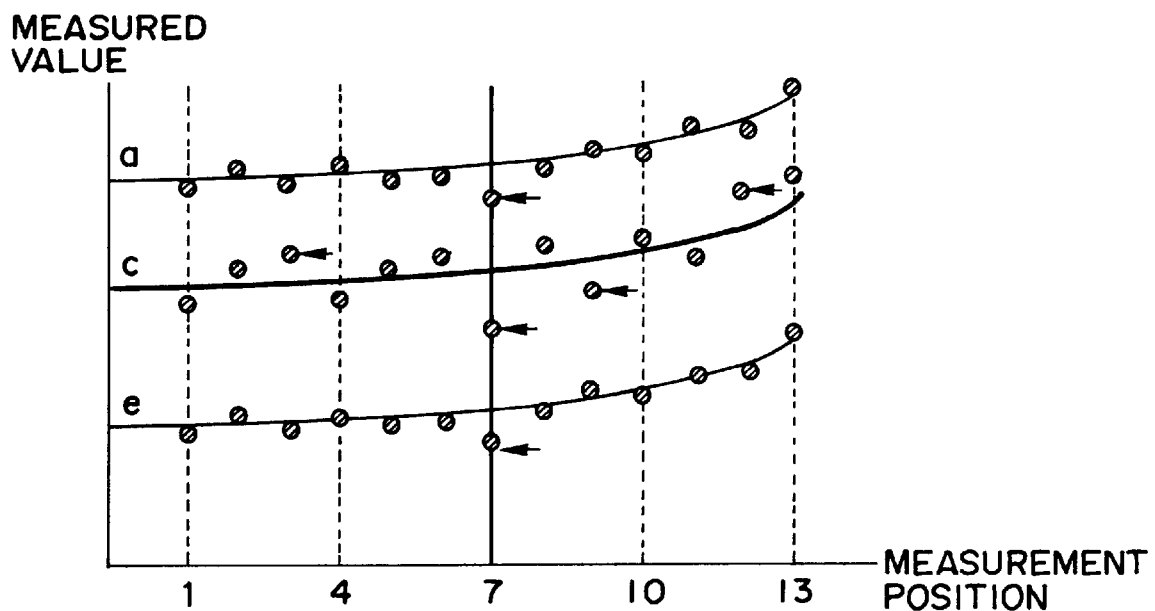
Figure 6:
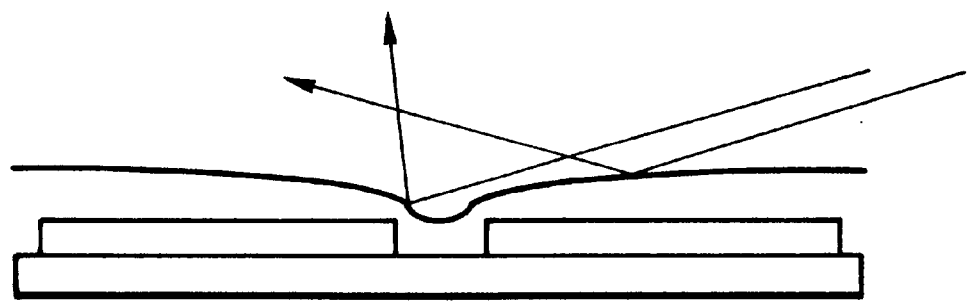
FIG. 6, is a schematic view for explaining the phenomenon that may occur at a surface level difference between chips of a wafer, in the embodiment of FIG. 1.
Figure 7A:
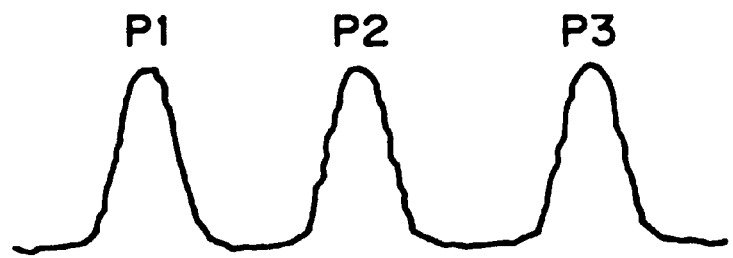
FIGS. 7A and 7B are schematic views, respectively, for explaining detection signals produced in the embodiment of FIG. 1.
Figure 7B:
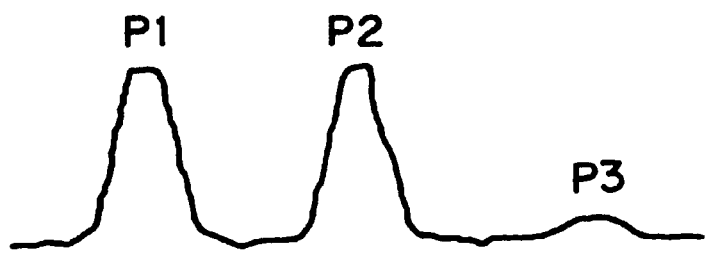

An example of scan measurement of a focus value to an exposure region of a wafer, while holding the stage height correction system fixed, will now be described. As shown in FIG. 5A, an exposure region is divided into four zones, and measurement is made to thirteen points while scanning these zones with five focus measurement sensors a–e. FIG. 5B shows the result of measurement. In FIG. 5B, for better understanding, measured values of sensors b and d are not plotted. The abscissa denotes the position coordinate in the scan direction, and the ordinates represents a focus measured value. Each dot represents a measured result at a measurement position by a corresponding sensor. Curves in the drawing are approximation curves as having been calculated in accordance with a least square method, for example. The surface irregularity of a wafer should inherently be less than the tolerance depth of a projection lens. However, at a portion of a scribe line or a peripheral circuit portion, there may be inclination of a resist surface such as shown in FIG. 6. In such portion, reflection light cannot be collected accurately, and a detection waveform may be such as shown in FIG. 7B, having a peak P2 (asymmetric) or a peak P3 (weak peak). In such a case, the result of processing will not reflect the actual value. If, as described, an approximation curve is determined by calculation from measured values, obtained through scan measurement, while holding the stage fixed, and a deviation between an actually measured value and the approximation curve is detected at each measurement position, and if the amount of deviation exceeds a predetermined value, correct focus detection can be attained by excluding such measurement point out of the measurement points during actual scan exposure. Also, if in all the measured values the amount of deviation is large, such as in the case of the measured values of the sensor c in FIG. 5B, all the measurements at that position may be disregarded as null, and the correction amount of the focus or the tilt may be calculated on the basis of the remaining sensors. By selecting those positions where measurement results are stable, as described above, it is possible to obtain stable measured values over the whole wafer surface and, thus, to perform correct focus detection to the whole wafer surface.

Figure 8A:
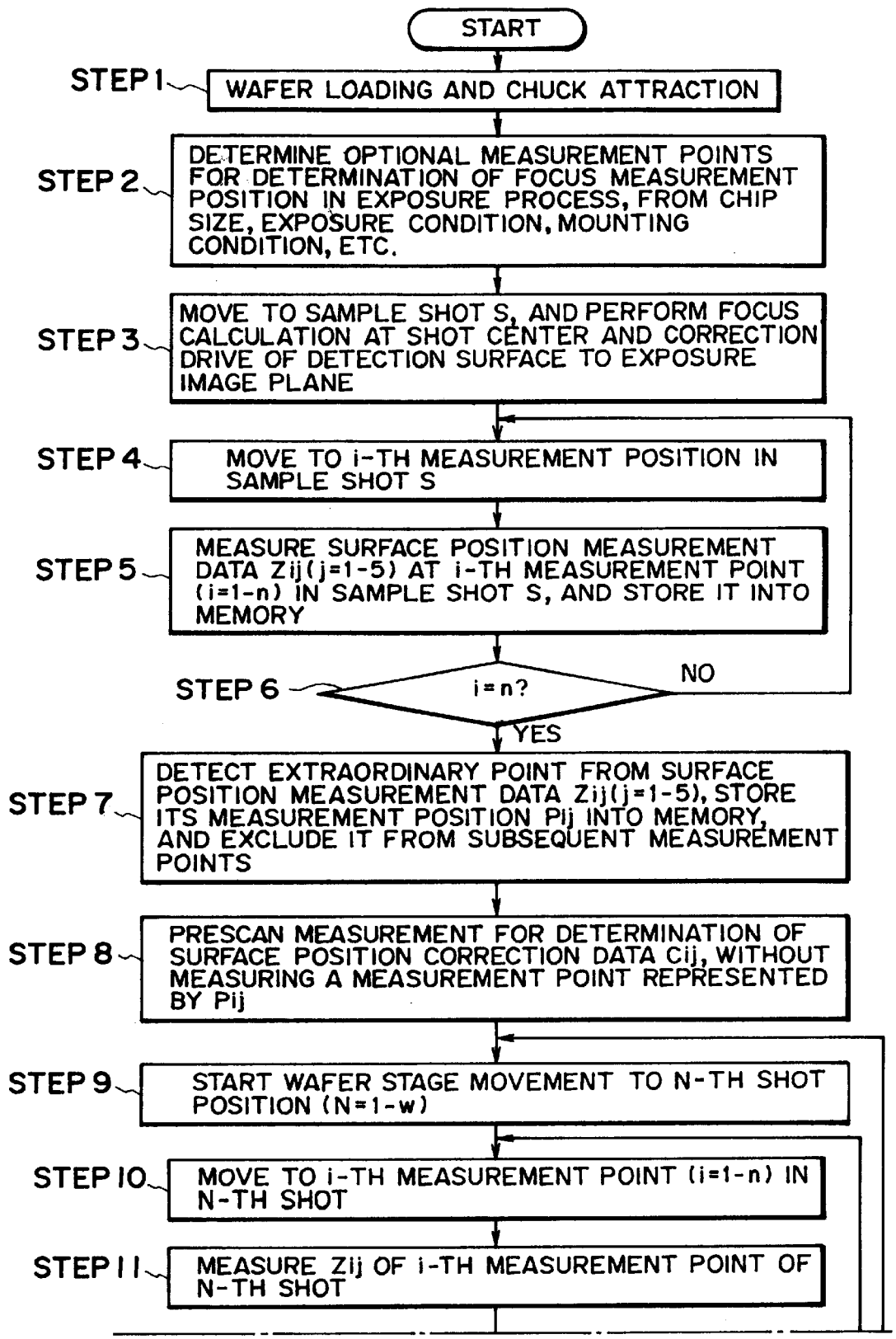
FIG. 8 is a schematic diagram illustrating the relationship between FIGS. 8A and 8B, which are flow charts for explaining the outline of the sequence for measurement point selection, offset measurement and surface position correction drive for each shot in the exposure process, in a surface position detecting method according to an embodiment of the present invention.
Figure 8B:
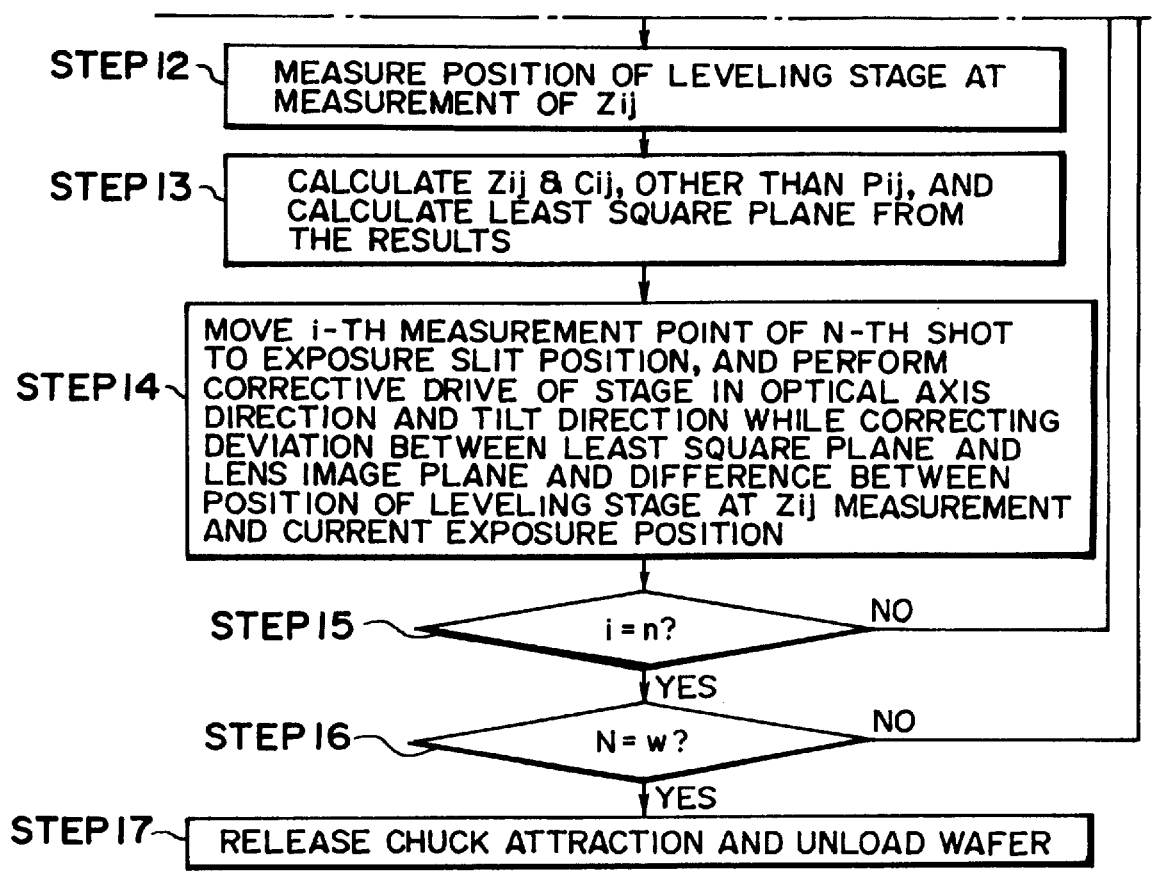

Referring to FIGS. 8A and 8B, a correction sequence will be explained. At step 1, a wafer is loaded and it is attracted and held by a chuck. At step 2, measurement points for first a prescan, that is, optional measurement points in a shot for a second prescan or those for an exposure process, are calculated. More specifically, from the standpoint of response time of a correction system or the sampling theorem as described hereinbefore, a necessary and sufficient number of measurement points is calculated. In this case, taking a number larger than the number of measurement points in the exposure process may be advantageous with respect to a determination of the measurement points at step 7 below. Except in a case where the subject to be examined is a first print, at this stage in procedure the alignment measurement of the whole wafer is effected and the positioning is completed. Then, at step 3, a shot about the center of the wafer, which is less affected by the chuck, is selected as the subject shot of measurement in the first prescan, and focus position correction is performed with respect to the shot center. After this, the stage will be moved only in the scan direction, and Z-direction correction will not be made.

At step 4, the stage is moved to the first measurement point as calculated at step 2. At step 5, a focus measured value Zij (j=1 to 5) at that position is measured, and it is memorized. Then, with loop checking at step 6, the procedure is looped until measurements at all the measurement points n are completed. At step 7, approximation curves such as shown in FIG. 5B are determined by calculation, from all the measured values of Zij having been stored in a memory. Deviation between the actually measured value and the approximation curve is detected, with respect to each of the measured positions. If the deviation is larger than a predetermined value, corresponding measurement point may be excluded from the measurement points in actual scan exposure. Those measurement points Pij, for which deviation has been determined as large, may be excluded from the measurement points in later measurement operations. Also, in consideration of response speed for correction, measurement points in exposure process are determined so that a necessary least number is selected and there does not occur eccentricity of measurement points. More specifically, those portions may be selected so that a scribe line is excluded, that the correction cycle is approximately periodic and that change in measurement value is slow. Although there may be a case where the surface has extraordinarily large surface irregularity or a case where measurement points cannot be selected, in such a case it is not always necessary that the measured values at the measurement points are effective for all the five points. If there is a sufficient span, at least two points may be enough to calculate the tilt amount. For those final measurement points thus determined, at step 8 the second prescan is performed to measure offset of the measurement system which may be attributable to resist surface irregularity, for example. With the procedure described above, selection of optimum measurement points and measurement offset at those positions, for correctly bringing each exposure region into registration with the focal plane of the projection system, are determined. On the basis of the data thus obtained, the wafer exposure procedure at steps 9 to 16 is performed. After completion of exposures of all the exposure shots of the wafer, checked at step S16, the wafer is unloaded at step 17.

EXAMPLE 2

Figure 8:
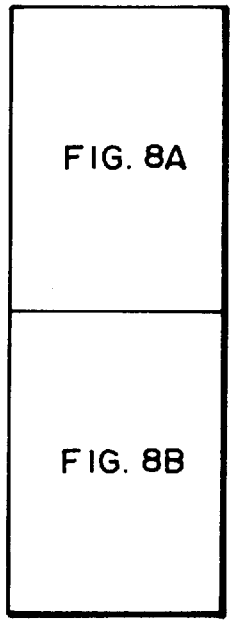

In this example, like Example 1 described above, scan measurement of focus value is performed to the exposure region of a wafer, while holding the state height correction system fixed. Simultaneously with calculation of measured values, a characteristic parameter of a detected waveform is calculated. As has been described hereinbefore, in a height detection system of the oblique light projection type, the detection light path is limited so as to detect only the reflection light having substantially the same angle as the incidence angle, in order to avoid noise light. For this reason, there is a possibility that, if a surface having a small inclination is to be detected, the intensity of detected light becomes extraordinarily low. For example, a focus detection waveform in a case of first print may have good balance and good symmetry such as shown in FIG. 7A, because there is no pattern formed on the wafer. If the process goes on, however, there may be produced an asymmetry (P2) or degraded S/N (P3) where the intensity of detected light is extraordinarily low. This may cause a measurement error or distributed results. In such a case, however, by calculating the characteristic amount of the waveform itself, that is, the quantity of reflected light or symmetry of the waveform, for example, it is possible to discriminate whether the point is appropriate for obtaining a stable measured value or not, without relying on statistically processing the measurement results. At step 5 of FIG. 8, in the focus measurement, calculation of the characteristic amount such as described above is executed additionally, and the result is memorized. At step 8 later, a discrimination is made to it. By these processes, it is possible to enhance the reliability of measurement point selection.

EXAMPLE 3

For measurement through the first prescan, from the relation described hereinbefore, a larger number of measurement points may be attainable with a shorter measurement time and, as a consequence of it, a more accurate characteristic of surface irregularity in the exposure region can be detected. However, this applies a larger load to the measurement system. While the scan speed during the exposure process may be changed in accordance with the resist sensitivity or the required throughput, it is not necessary that the measurement by the first prescan is effected at the same speed as the scan speed in the exposure process, since the measurement by first prescan is to be done only to a single shot of a first wafer of one lot. Rather, executing measurements at many points at a slow speed will be convenient for selection of positions for focus measurement in the exposure process. More particularly, the determination of optional measurement points at step 2 of FIG. 8, a particular note is paid to assure that extraordinary point calculation at step 7 can be performed without difficulty and, as an example, measurement points are determined so that detection marks are superposed one upon another sufficiently. Also, the scan speed during the first prescan measurement is determined while giving the priority to the response speed of the measurement system. When a discrimination of extraordinary value is to be made on the basis of the measured values thus obtained, an extraordinary point can be easily selected and excluded by, for example, passing a measured value of a certain sensor through a high-frequency passing filter. Also, for enhanced precision of measured value in determination of measurement points, waveform data may be taken N times per one-point measurement and, after data taking at all the measurement points, the measured values of respective points may be calculated. An average of measured values of every N-time measurements at one point may be used as a measured value at that point. Alternatively, measurement data may be taken at points of a number, larger than the number of measurement points during the actual exposure process, and through a slow-speed scan, and average calculation may be made with respect to a few points (this can be called "movement average") to thereby prepare the data for calculation of optional measurement points.

EXAMPLE 4

In the point of matching between plural apparatuses, the relation between the focus beam position and the exposure position has to be controlled precisely. For example, in a case where, with respect to the scan direction, the above-described relation varies between separate apparatuses, even if calibration is made to the image plane position and the focus measurement origin by executing an actual exposure process, the result depends on the measurement position in the scan direction and, therefore, it is not possible to accomplish correct focus offset correction without determining it in every apparatus. Further, if an adjusting mechanism is added to assure matching between separate apparatuses in respect to the above-described relation, it causes an increase in size and cost.

Figure 9:
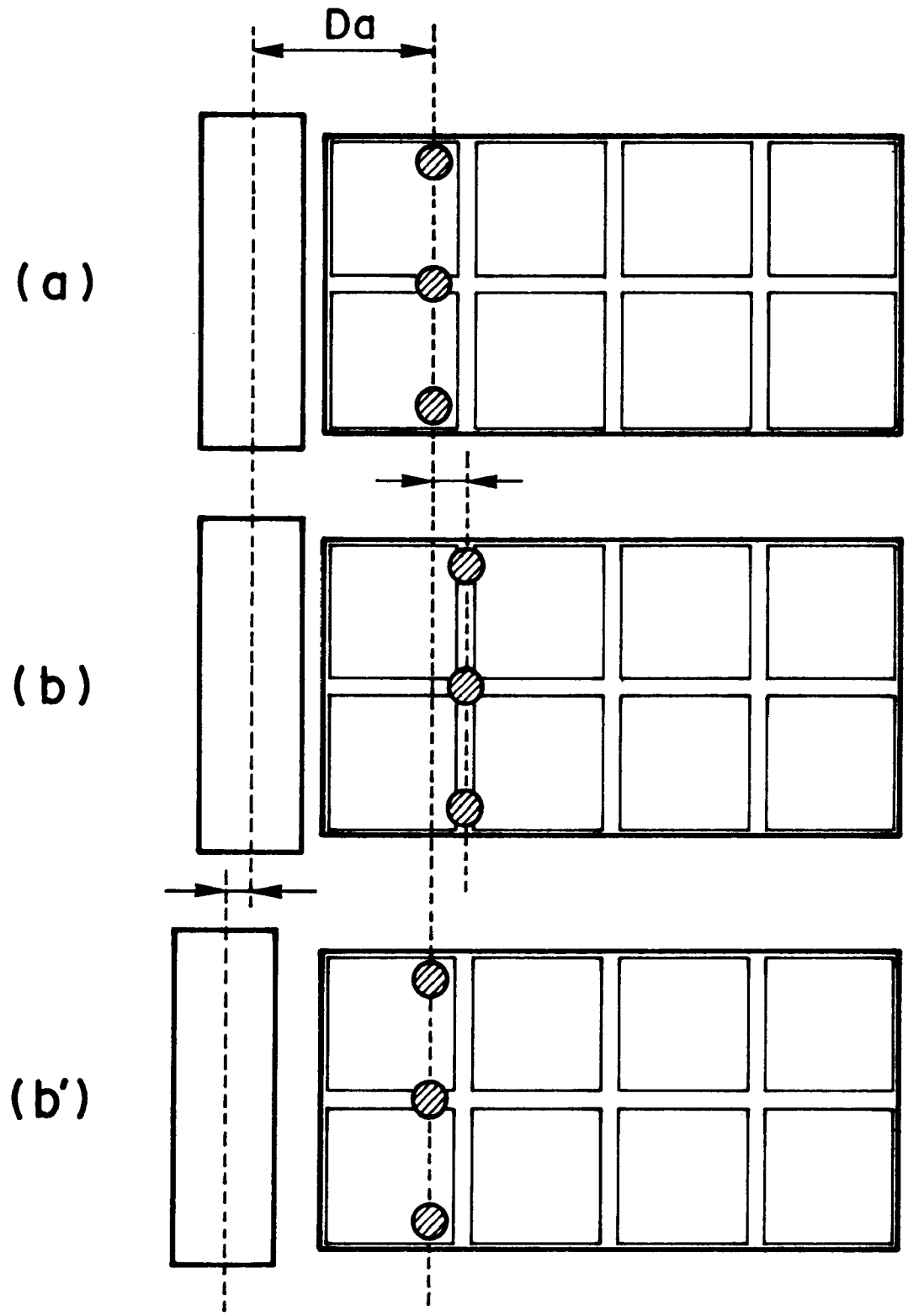
FIGS. 9($a$–$b'$) is a schematic view for explaining an error related to sensor mounting position, in an example according to the present invention.

In consideration of this, the above-described relation may be detected beforehand, and the relative difference of them may be controlled as an offset. In that case, it is possible, in the selection of measurement points, to assure matching between the apparatuses as corrected. Also, once the exposure condition is determined with respect to one apparatus, the values of that condition may be applied to the other apparatuses. This will be explained in greater detail, in conjunction with FIG. 9, portions (a)–(b'). It is now assumed that the calibration between the focus original and the projection lens image plane is made in a first apparatus A, under the condition shown in FIG. 9, portion (a), that is, under the relation Da between the exposure slit position and the exposure position as illustrated. If a correction value obtained thereby is to be applied to a second apparatus B which is under the condition shown in FIG. 9, portion (b), the result is that the position to be observed with a focus detection beam in the state in which the lens vs. stage positioning has been in the relation Da above, differs from that in the first apparatus A. Consequently, what is detected in this case is the position which is deviated by the difference in the distance between the exposure slit position and the focus detection beam position, namely, by the difference between the apparatuses in the mount position of the focus detection system. Due to such a difference in the mounting position between separate apparatuses, calibration has to be done with respect to each of the apparatuses. However, by executing the procedure at step 2 and step 7 of FIG. 7 while taking into account the difference in mount position of focus detection system, between separate apparatuses, as shown in FIG. 9, portion (b'), the necessity of calibration for every apparatus can be avoided, and simple operation and control is assured.

The prescan measurement for selection of measurement positions as described hereinbefore may be performed at respective processes where patterns to be formed are different. However, it is sufficient to execute the measurement only to one wafer of one lot. For the same process to be performed later, the measurement positions as determined with respect to the first wafer in the lot and stored in a memory may be used in the focus measurement and correction, with good results. High precision leveling correction and exposure can be attained without decreasing the throughput. If it is expected that the wafers in one lot have large differences, prescan measurement for measurement position selection may be performed with respect to a few wafers, and common measurement positions to those wafers may be used with respect to the remaining wafers. This may assure further enhancement of precision.

Second Embodiment

A second embodiment of the present invention will now be described. Since a slit-scan type exposure system to be used in this embodiment has an essentially the same structure as of the first embodiment described above, an explanation of it will be omitted here. In the following, a method of detecting the height position (level) of an exposure region of a wafer 4 in accordance with a surface position detection of the present invention will be described.

FIG. 10(*a*), shows the relation between a wafer height measurement position and the position of exposure region during the wafer exposure process. It is assumed here that a pattern of a reticle is going to be printed on an exposure region C on the surface of a wafer 41 which is being moved in a direction of an arrow X. In FIG. 10(*a*), height measuring means 40B is provided at a position before the center A of the exposure region C with respect to the wafer movement direction, which position is spaced by a distance d from the center A. At the moment as the point A comes to a position just below the height measuring means 40B, the height of the wafer surface at the point A is measured. Then, at the moment as the point A comes to the center of the exposure region C, the wafer height is adjusted into registration with the exposure plane. The wafer height measurement sampling interval in this case corresponds to the time period by which the wafer moves through the distance d.

When the height of the wafer surface should be changed during the exposure process, there may be three cases. The first case is for a variation with a change in height within a chip. The second is for a variation at the junction (scribe line) of chips. The third is for a variation as an exposure region comes from the outside into the inside of the wafer.

As regards the variation within a chip, since the cell portion and the peripheral circuit portion may be generally flattened through a CMP process, for example, the surface level difference may be about 1–2 microns. As regards the surface level difference between the chip and the scribe line, while it may be larger than that within the chip, any way it may be within a range of a few microns. To these variations, for exposure of an outer peripheral portion of a wafer, the wafer surface is first held at an appropriate level. Then, after the height measuring means comes to a position on the wafer where the height measurement is attainable, the height measurement is performed. Then, until the exposure region moves on to the wafer, the height drive is performed. As a consequence, there are cases in which the wafer height should be changed by about ten microns within a time period in which the wafer moves through the distance from the center of the exposure region to the wafer height measuring sensor.

Thus, the response speed of the wafer height control system should not be determined in consideration of the surface level difference within the wafer only. Rather, the response speed of the wafer height control system should be determined in the case as the measuring system comes from the outside into the inside of the wafer during the exposure process. For this reason, the response speed of the wafer height control system has a sufficient speed, enough for drive through a distance corresponding to the variation in height within the chip, in the time period in which the wafer moves through a distance from the center of the exposure region to the wafer height measuring sensor.

FIG. 10(*c*) shows the relation among a wafer surface 41, a wafer height 44 as moved, and a focus error 45 in a case where, in the example of FIG. 10(*a*), the response speeds of the detection system and the driving system are higher as compared with the wafer scan speed. Since the response speed is higher than the measurement interval, there is a larger focus error between measurement points.

FIG. 10(*d*) shows an example where the sampling interval is ⅕ of that of the FIG. 10(*c*) An example. Also, there is shown the relation among a wafer surface 41, a wafer height 46 as moved, and a focus error. It is seen that, as compared with FIG. 10(*c*), the focus error is smaller. However, since one-dimensional CCD line sensors are used in the photo-electric converting means group 19, and from the relation between the light quantity of the light source 10 and the accumulation time of CCD, it is not possible to reduce the sampling time immoderately. Further, even if the light quantity of the light source 10 is enlarged and the sampling interval is made shorter, the quantity of traffic flowing through the data bus of the measurement system may also increase, such that the control system may become complicated and expensive. Anyway, since the exposure region has a fixed width in the wafer scan direction, it is substantially impossible to follow the surface irregularity of a period shorter than that width. Thus, performing the measurement with an excessively short interval is not meaningful.

In the present embodiment, in consideration of the above, the sampling interval d is unchanged and, in place, the interval of drive signal application is made shorter than the sampling interval. Also, this interval of drive signal application is made shorter than the response time of the control system. As regards the data between sampling points, those which are obtainable through interpolation, such as linear interpolation or multiple approximation interpolation, of values based on measured data obtained at plural sampling points, including the preceding sampling point and the subsequent sampling point, are used.

Figure 11:
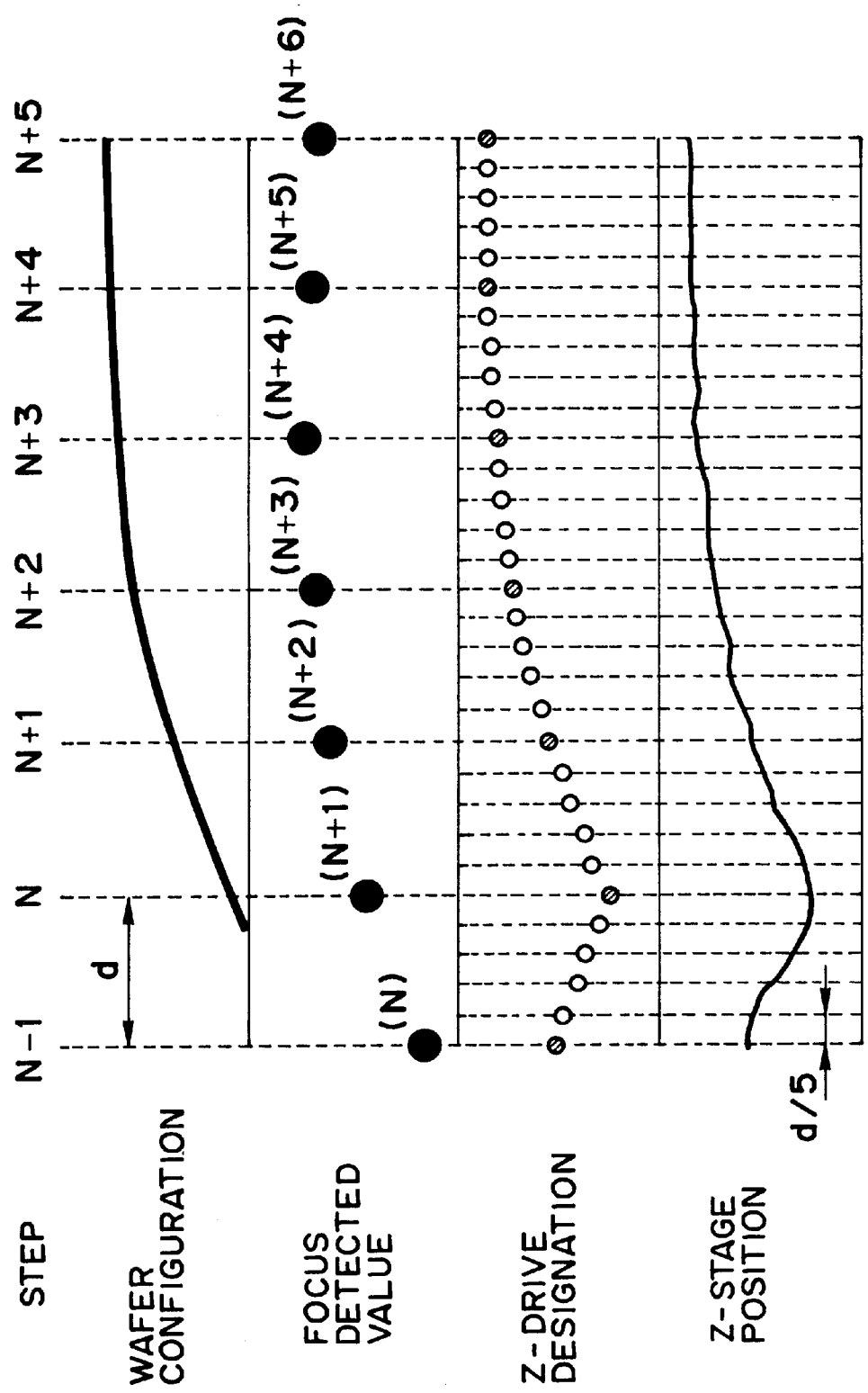
FIG. 11 is a schematic view for explaining the relation between wafer height, exposure region and height measurement position, in a second embodiment of the present invention.

FIG. 11 illustrates an example of drive during wafer exposure process, according to the present invention. For simplicity of illustration, it is assumed that there is only one wafer height measuring means, the movement and measurement direction is in the same direction (Z direction) as the direction of the lens optical axis, and there is no drive in the wafer tilt direction ($\alpha$ or $\beta$). The wafer height measurement sampling interval is still d, and Z-position drive signals are applied with an interval d/5. The response time of the Z stage control system is longer than the time period in which the wafer moves through a distance d/5. At the measurement step N−1, the wafer height measuring means measures the position of the point N on the wafer. The center of the exposure region is at the position of point N−1, wherein the position N−1 is outside the wafer. Further, the designated drive amount between these steps is the one as obtained through interpolation of height measured values obtained by the preceding and succeeding measurements.

Under these conditions, at step N−1, the wafer surface is not at the exposure position, and an appropriate drive designation signal is applied to move the Z stage at an appropriate position. This position may be at a predetermined height from the wafer chuck, or it may be the height of the wafer position closest to the wafer position having been measured earlier. Alternatively, a value at an outside peripheral portion of the wafer may be measured beforehand, and the measured value may be used. The designated drive amount between step N−1 and step N may be obtained through interpolation, on the basis of the wafer surface height as detected at step N−1 and of the drive designated value at the step N−1.

At step N, the center of exposure position comes on to the wafer, and the wafer exposure process is initiated. The height drive correction value at step N is the value which is based on the wafer height measured value at step N−1 and, at this moment, the wafer surface height at step N+1 is performed. The drive designated value from step N to step N+1 may be determined through interpolation, on the basis of the wafer surface height at the center of exposure position in step N+1, as measured at step N (i.e., measurement position of the wafer height measuring means at step N) as well as the wafer height drive designated value for step N. Similar operations as described above are repeated with respect to step N+2 and steps following it, and wafer height drive is performed during the exposure process.

With the procedure of this embodiment described above, the focus error is reduced. Also, since the target value is changed with intervals shorter than the response speed of the Z stage control system, there does not occur vibration which otherwise may be produced in the drive during convergence to a target value. Further, since the measurement time is longer as compared with a case where the sampling interval is made equal to d/5, the system can be structured by use of a simple control system.

As regards the target value to be applied, the response of the control system may be taken in to account such that a value corresponding to response delay may be added to the value obtained through interpolation.

While in FIG. 11 the wafer height measurement and the Z-position drive signal application in each step are performed at the same timing, the timing of Z-position drive signal application may be changed while taking the delay of driving system into account. Further, while in the illustrated example there is no drive in the wafer tilt direction ($\alpha$ or $\beta$), as a matter of course, the present invention is applicable also to measurement and drive with respect to such tilt direction.

Figure 12A:
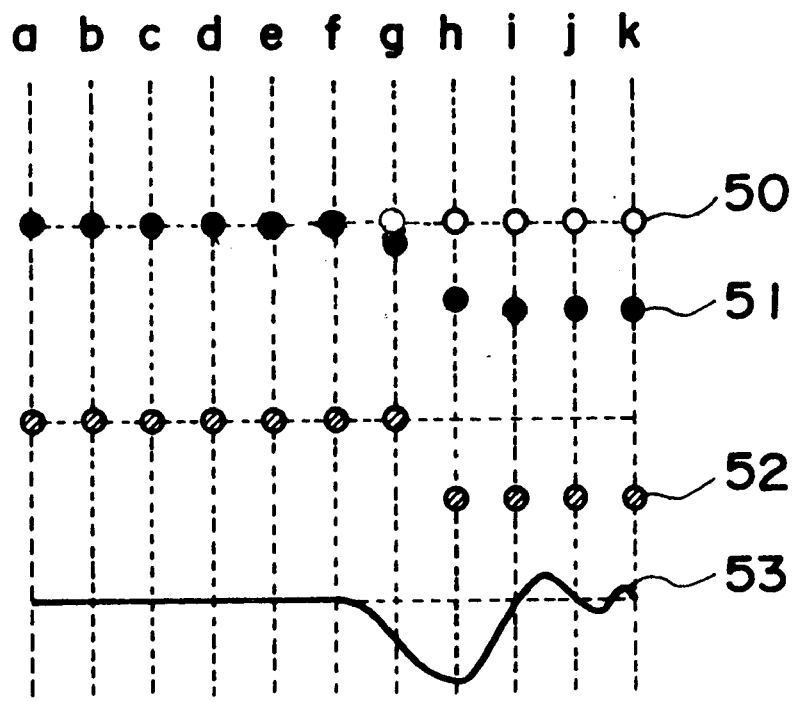
FIGS. 12A and 12B are schematic views, respectively, for explaining the relation between the wafer height and positional deviation of X stage, in the second embodiment of the present invention.

On the other hand, application of the present invention is effective to solve a problem of degradation of line width precision due to abbe correction. FIG. 12A shows motion of an X-stage in relation to abbe correction, wherein the axis of abscissa denotes time. The spacing between points a and k corresponds to the time required for a wafer to scan through the distance d between the center of exposure region and the wafer height detection system. The response speed of the stage is the time required for the wafer to move through a distance d/2. Points a, b, . . . , and k represent the timing of sampling and rewriting of target value, for wafer and reticle stage interferometers. Z sampling and driving is performed only once during the period from a to k.

In FIG. 12A, denoted at 50 is a read-out value of the interferometer in a case where there is no Z-axis drive. Inherently, it should be illustrated by a curve since the target value varies between points a and k. For convenience in explanation, however, it is illustrated with a constant target value between points a and k. If Z-axis drive is effected at timing of point f, the read-out value of the interferometer may shift as depicted at 51, by an amount corresponding to an abbe error. In order to correct this, the target value is corrected at timing of point h by an amount corresponding to the abbe error. Since however the amount of correction at 52 is large, deviation of the X stage from its target value becomes large, after point g, as depicted at 53.

Figure 12B:
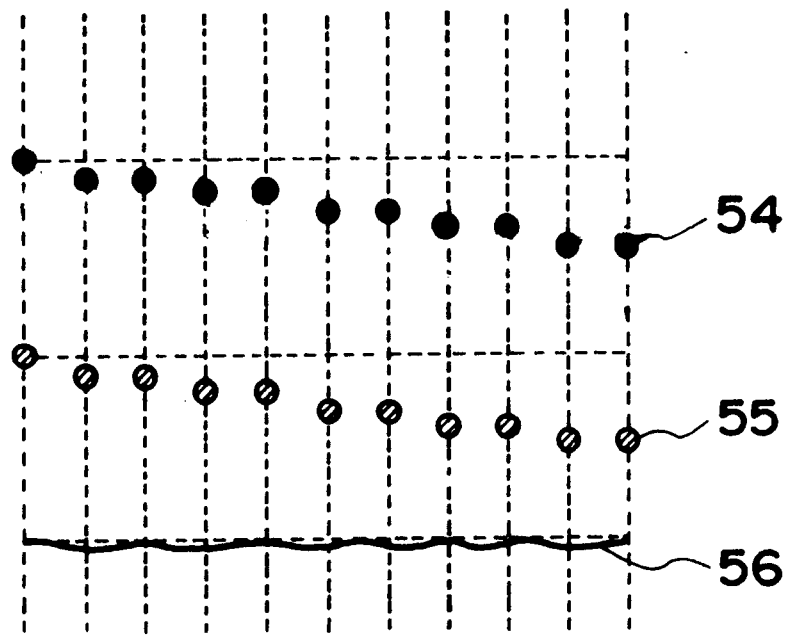

FIG. 12B shows motion of the X-stage in relation to the abbe correction, in a case where the present invention is applied. Z-axis drive is effected at timings of points a, c, e, g, i, and k. The target value for the interferometer is changed at points c, d, f, h, and j, in accordance with the drive amounts of a, c, e, g, i, and k, respectively. Final correction values for the interferometer, namely, those at 52 and 55, are of the same amount. However, since the target value for the stage (i.e., the correction value for the interferometer) is changed with intervals faster than the response speed of the X-stage and the correction is done frequently, stage vibration is not created and the deviation 56 from the target value is smaller than that at 53.

As described, when the present invention is applied to a case where an abbe error produced by Z-position drive is to be corrected, it is possible to reduce the positional error in the X direction, such that an exposure process free from or with reduced variation in printed line width is enabled. Although the foregoing description has been made with respect to the X stage which moves in the scan direction, the same applies to a Y stage. The abbe correction may be made with respect to the reticle stage side, not on the wafer stage side. However, in such case, the correction amount may increase in accordance with the magnification of the reduction projection lens.

While the invention has been described with reference to the structures disclosed herein, it is not confined to the details set forth and this application is intended to cover such modifications or changes as may come within the purposes of the improvements or the scope of the following claims.

What is claimed is:

1. A surface position detecting method for detecting a position of a surface, with surface irregularity, with respect to a predetermined detection direction while scanning the surface in a scan direction perpendicular to the detection direction, said method comprising the steps of:

pre-scanning the surface in the scan direction, by which data, related to the surface at plural optional measurement positions thereof, is produced;

selecting plural measurement positions out of the optional measurement positions on the basis of the data; and scanning the surface in the scan direction and detecting, during the scan, the position of the surface with respect to the detection direction on the basis of the selected measurement positions.

2. A method according to claim 1, wherein the data includes position data with respect to the detection direction and shape data related to a detection signal.

3. An exposure method for transferring, by exposure, a pattern onto a substrate while scanning the substrate in a scan direction, said method comprising the steps of:

pre-scanning the substrate in the scan direction, by which data related to the surface of the substrate at plural optional measurement positions thereof is produced;

selecting plural measurement positions out of the optional measurement positions on the basis of the data; and scanning the substrate in the scan direction for transferring the pattern onto the substrate, and detecting, during the scan, the position of the surface of the substrate with respect to a predetermined detection direction intersecting the scan direction, on the basis of the selected measurement positions.

4. A method according to claim 3, wherein the data includes position data with respect to the detection direction and shape data related to a detection signal.

5. A method according to claim 3, wherein the pre-scanning is performed at a scan speed lower than that of the scan for detection.

6. A method according to claim 3 wherein the optional measurement positions are determined on the basis of the scan speed for scanning the substrate for detection.

7. A method according to claim 3, wherein the substrate comprises a wafer on which a chip pattern is formed.

8. A method according to claim 3, further comprising the steps of producing the data in relation to plural wafers having chip patterns the same as that of the wafer, storing information related to measurement positions determined on the basis of the data, and using all of or at least one of the measurement positions being stored for the scan for detection.

9. A surface position adjusting method for adjusting a position of a surface of a substrate, said method comprising the steps of:

scanning, with respect to a measurement region of a measuring device, the substrate in a scan direction, and measuring, by use of the measuring device, a position of a surface portion of the substrate, located at the measurement region, with respect to a measurement direction different from the scan direction to produce a measured value, wherein the measurement by using the measuring device is repeated at a predetermined measurement interval;

adjusting the position of the substrate with respect to the measurement direction during a period in which the surface portion of the substrate is scanned from the measurement region to an adjustment region, along the scan direction, wherein the adjustment region is spaced from the measurement region by a predetermined distance along the scan direction, wherein the position adjustment of the substrate is performed on the basis of a predetermined target value, and wherein the target value is determined on the basis of the measured value; and changing the target value during a period in which the surface portion of the substrate is scanned from the measurement region to the adjustment region, along the scan direction, at an interval shorter than the predetermined measurement interval, wherein the target value related to a portion of the substrate surface between measured portions is determined on the basis of measured values of the measured portions.

10. A method according to claim 9, wherein the target value for the portion between the measured portions is determined while interpolating measured values of the measured portions.

11. A method according to claim 9, wherein the interpolation is made on the basis of a linear interpolation or a multiple approximation interpolation.

12. A method according to claim 9, wherein, for corrective drive of the substrate based on measurement of the position thereof with respect to the scan direction or a direction perpendicular to the scan direction, the corrective drive is performed with an interval shorter than the predetermined measurement interval.

13. An exposure method for transferring a pattern onto a substrate while scanning the substrate in a scan direction, said method comprising the steps of:

scanning, with respect to a measurement region of a measuring device, the substrate in a scan direction, and measuring by use of the measuring device, a position of a surface portion of the substrate, located at the measurement region, with respect to a measurement direction different from the scan direction to produce a measured value, wherein the measurement by using the measuring device is repeated at a predetermined measurement interval;

adjusting the position of the substrate with respect to the measurement direction during a period in which the surface portion of the substrate is scanned from the measurement region to an adjustment region, along the scan direction, wherein the adjustment region is spaced from the measurement region by a predetermined distance along the scan direction, wherein the position adjustment of the substrate is performed on the basis of a predetermined target value, and wherein the target value is determined on the basis of the measured value; and changing the target value during a period in which the surface portion of the substrate is scanned from the measurement region to the adjustment region, along the scan direction, at an interval shorter than the predetermined measurement interval, wherein the target value related to a portion of the substrate surface between measured portions is determined on the basis of measured values of the measured portions.

14. A method according to claim 13, wherein the target value for the portion between the measured portions is determined while interpolating measured values of the measured portions.

15. A method according to claim 14, wherein the interpolation is made on the basis of a linear interpolation or a multiple approximiation interpolation.

16. A method according to claim 13, wherein, for corrective drive of the substrate based on measurement of the position thereof with respect to the scan direction or a direction perpendicular to the scan direction, the corrective drive is performed with an interval shorter than the predetermined measurement interval.

* * * * *

UNITED STATES PATENT AND TRADEMARK OFFICE
CERTIFICATE OF CORRECTION

PATENT NO. : 5,920,398

DATED : July 6, 1999

INVENTOR(S): TAKEHIKO IWANAGA, ET AL.

It is certified that error appears in the above-identified patent and that said Letters Patent is hereby corrected as shown below:

COLUMN 1,
Line 19, "Recently" should read --Recently,--;
Line 32, "larged filed-size" should read --large-field-size--;
Line 41, "illumination.light" should read --illumination light--;
Line 55, "method" should read --a method--;
Line 57, "the" should be deleted; and
Line 64, "water" should read --wafer--.

COLUMN 2,
Line 49, "to-be" should read --to be--.

COLUMN 7,
Line 28, "is" should read --are--; and
Line 31, "is" should read --are--.

COLUMN 9,
Line 13, "image" should read --image is--.

COLUMN 12,
Line 43, "in procedure" should read --in the procedure,--.

UNITED STATES PATENT AND TRADEMARK OFFICE
CERTIFICATE OF CORRECTION

PATENT NO. : 5,920,398

DATED : July 6, 1999

INVENTOR(S): TAKEHIKO IWANAGA, ET AL.

It is certified that error appears in the above-identified patent and that said Letters Patent is hereby corrected as shown below:

COLUMN 14,
line 9, "the" ($2^{nd}$ occurrence) should read --in the--;
line 32, "and" should read --an--; and
line 54, "a" should be deleted.

Figure 10A:
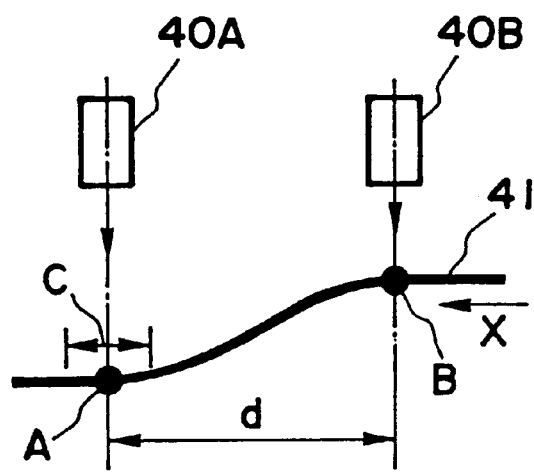
FIGS. 10($a$–$d$) is a schematic views for explaining the relationship between wafer height, exposure region and height measurement position.
Figure 10B:
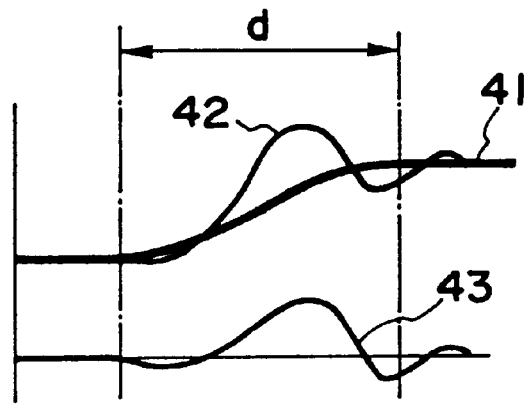
Figure 10C:
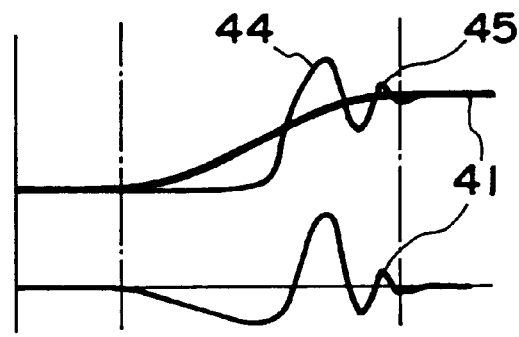
Figure 10D:
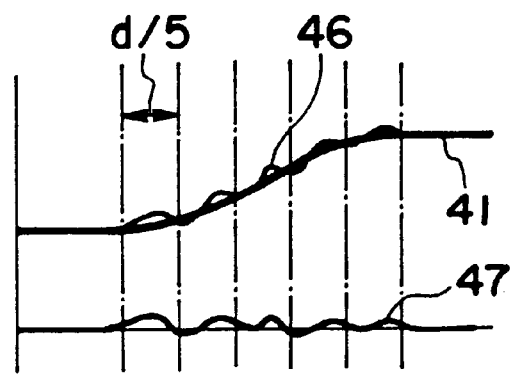

COLUMN 15,
line 44, "FIG. 10(a)," should read --FIG. 10(a)--.

COLUMN 16,
line 39, "An" should be deleted.

COLUMN 18,
line 48, "such" should read --such a--.

COLUMN 19,
line 28, "claim 3" should read --claim 3,--; and
line 33, "claim 3," should read --claim 7,--.

UNITED STATES PATENT AND TRADEMARK OFFICE
CERTIFICATE OF CORRECTION

PATENT NO. : 5,920,398

DATED : July 6, 1999

INVENTOR(S): TAKEHIKO IWANAGA, ET AL.

Page 3 of 3

It is certified that error appears in the above-identified patent and that said Letters Patent is hereby corrected as shown below:

COLUMN 20,
Line 57, "appromxiation" should read --approximation--.

Signed and Sealed this

Eighteenth Day of April, 2000

Attest:

Q. TODD DICKINSON

Attesting Officer          Director of Patents and Trademarks